(12) United States Patent
Forejt et al.

(10) Patent No.: US 8,680,918 B2
(45) Date of Patent: Mar. 25, 2014

(54) HIGH VOLTAGE DRIVER AMPLIFIER FOR PIEZO HAPTICS

(75) Inventors: Brett Earl Forejt, Garland, TX (US); Mayank Garg, Richardson, TX (US); David John Baldwin, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 94 days.

(21) Appl. No.: 13/329,031

(22) Filed: Dec. 16, 2011

(65) Prior Publication Data

US 2013/0106514 A1 May 2, 2013

Related U.S. Application Data

(60) Provisional application No. 61/553,441, filed on Oct. 31, 2011.

(51) Int. Cl.
*H03F 3/68* (2006.01)
(52) U.S. Cl.
USPC .............................. 330/84; 330/98; 330/174
(58) Field of Classification Search
USPC ..................... 330/69, 84, 98, 99, 100, 174
See application file for complete search history.

(56) References Cited

U.S. PATENT DOCUMENTS

| | | | | | |
|---|---|---|---|---|---|
| 4,065,724 | A | * | 12/1977 | Wicklund, Jr. | 330/252 |
| 4,367,442 | A | * | 1/1983 | Tanaka et al. | 330/149 |
| 2012/0013403 | A1 | * | 1/2012 | Sahara et al. | 330/253 |

* cited by examiner

*Primary Examiner* — Steven J Mottola
(74) *Attorney, Agent, or Firm* — Alan A. R. Cooper; W. James Brady, III; Frederick J. Telecky, Jr.

(57) ABSTRACT

A high-voltage driver amplifier for piezo haptics comprises an input amplifier having a gain greater than one, a first amplifier of an amplifier pair coupled to an output of the input amplifier, a second amplifier of the amplifier pair coupled to the output of the input amplifier, a first impedance coupled between an output of the first amplifier of the amplifier pair and an input of the input amplifier, and a second impedance coupled between the output of the first amplifier of the amplifier pair coupled to an output of the second amplifier of the amplifier pair. A substantially capacitive load is coupled to the output of the second amplifier. The substantially capacitive load is a piezo-capacitance, wherein the piezo-capacitance is employed in haptics. The second impedance, a shunt impedance, allows for a feedback of output variations between the first amplifier and the second amplifier over the first impedance.

19 Claims, 4 Drawing Sheets

US 8,680,918 B2

HIGH VOLTAGE DRIVER AMPLIFIER FOR PIEZO HAPTICS

RELATED APPLICATIONS

This application claims priority from "High-Voltage Driver Amplifier for Piezo Haptics", Ser. No. 61/553,441 filed Oct. 31, 2011.

TECHNICAL FIELD

This application is directed, in general, to a high-voltage amplifier, and, more specifically, to a high-voltage amplifier that drives Piezo haptics.

BACKGROUND

In the burgeoning areas of vibrational haptics, Piezo elements are rapidly becoming the actuators of choice. These elements typically require very large voltage drives in order to create a desired level of haptical information for a user. Some of the highest levels of voltages to be driven for Piezo haptics can be 200 volts peak to peak (P2P).

In addition to the large drive voltages employed to drive Piezo elements of haptics, the Piezo elements present a load to the high-voltage driver that is nearly pure capacitance, which can typically range from one nanofarad to three microfarads. This can create issues in waste heat for a driver circuit, as the load, a nearly pure capacitive load, dissipates very little heat, and therefore coupling lines within the high-voltage driver can dissipate significant heat. Moreover, the driven signal is typically an amplitude modulated signal, with a range of carrier frequencies from 100 Hz to 100 kHz.

This scenario presents challenges to a prior-art high voltage amplifier, such as used in Piezo haptics, in terms of efficiency, such as power efficiency, quiescent current, and stability.

Moreover, some typical battery values used to drive a high-voltage driver amplifier for Piezo haptics are from 3 volts to 4.2 volts. A boost converter for Piezo haptics may need to create 105 volts to generate a 200 volt p2p differentially. Therefore, in this scenario, considering the step factor and the efficiency, a current delivered to the load is multiplied by a factor of almost forty times. Therefore, keeping quiescent current to a minimum on a prior art 100-volt and above rail is a significant issue.

Therefore, there is a need in the art to address at least some of the issues associated with a high-voltage amplifier that drives Piezo haptics.

SUMMARY

A first aspect provides a high-voltage driver amplifier for Piezo haptics comprising an input amplifier having a gain greater than one, a first amplifier of an amplifier parallel pair coupled to an output of the input amplifier, a second amplifier of the amplifier parallel pair coupled to the output of the input amplifier, a first impedance coupled between an output of the first amplifier of the amplifier pair and an input of the input amplifier, and a second impedance coupled between the output of the first amplifier of the amplifier pair and an output of the second amplifier of the amplifier pair. In some embodiments, a substantially capacitive load is coupled to the output of the second amplifier. The substantially capacitive load is a piezo-capacitance. The piezo-capacitance can be employed in haptics. The second impedance, a shunt impedance, allows for a feedback of output variations between the first amplifier and the second amplifier across the first impedance.

A second aspect provides a system, comprising an input amplifier having a gain greater than one, a first amplifier of an amplifier pair coupled to an output of the input amplifier, a second amplifier of the amplifier pair coupled to the output of the input amplifier, wherein a gain of the first amplifier and the second amplifier of the amplifier pair are each configured to be a value of substantially one. A first impedance is coupled between an output of the first amplifier of the amplifier pair and an input of the input amplifier, wherein the first impedance is a feedback element, and a second impedance is coupled between the output of the first amplifier of the amplifier pair and an output of the second amplifier of the amplifier pair. The second impedance, a shunt impedance, allows for a feedback of output variations between the first amplifier and the second amplifier across the first impedance. A substantially capacitive load is coupled to the output of the second amplifier, wherein the substantially capacitive load is a piezo-capacitance. The piezo-capacitance can be employed in haptics.

In a third aspect, a system comprises a system, comprising an input amplifier having a gain greater than one, a first amplifier of an amplifier pair coupled to an output of the input amplifier, and a second amplifier of the amplifier pair coupled to the to then output of the input amplifier. A first impedance is coupled between an output of the first amplifier of the amplifier pair and an input of the input amplifier, and a second impedance is coupled between the output of the first amplifier of the amplifier pair and an output of the second amplifier of the amplifier pair. A current source is coupled to the input of the input amplifier. The substantially capacitive load is a piezo-capacitance, wherein the piezo-capacitance can be employed in haptics. The second impedance, a shunt impedance, allows for a feedback of output variations between the first amplifier and the second amplifier across the first impedance.

BRIEF DESCRIPTION OF THE DRAWINGS

Reference is now made to the following descriptions.

DETAILED DESCRIPTION

Figure 1:
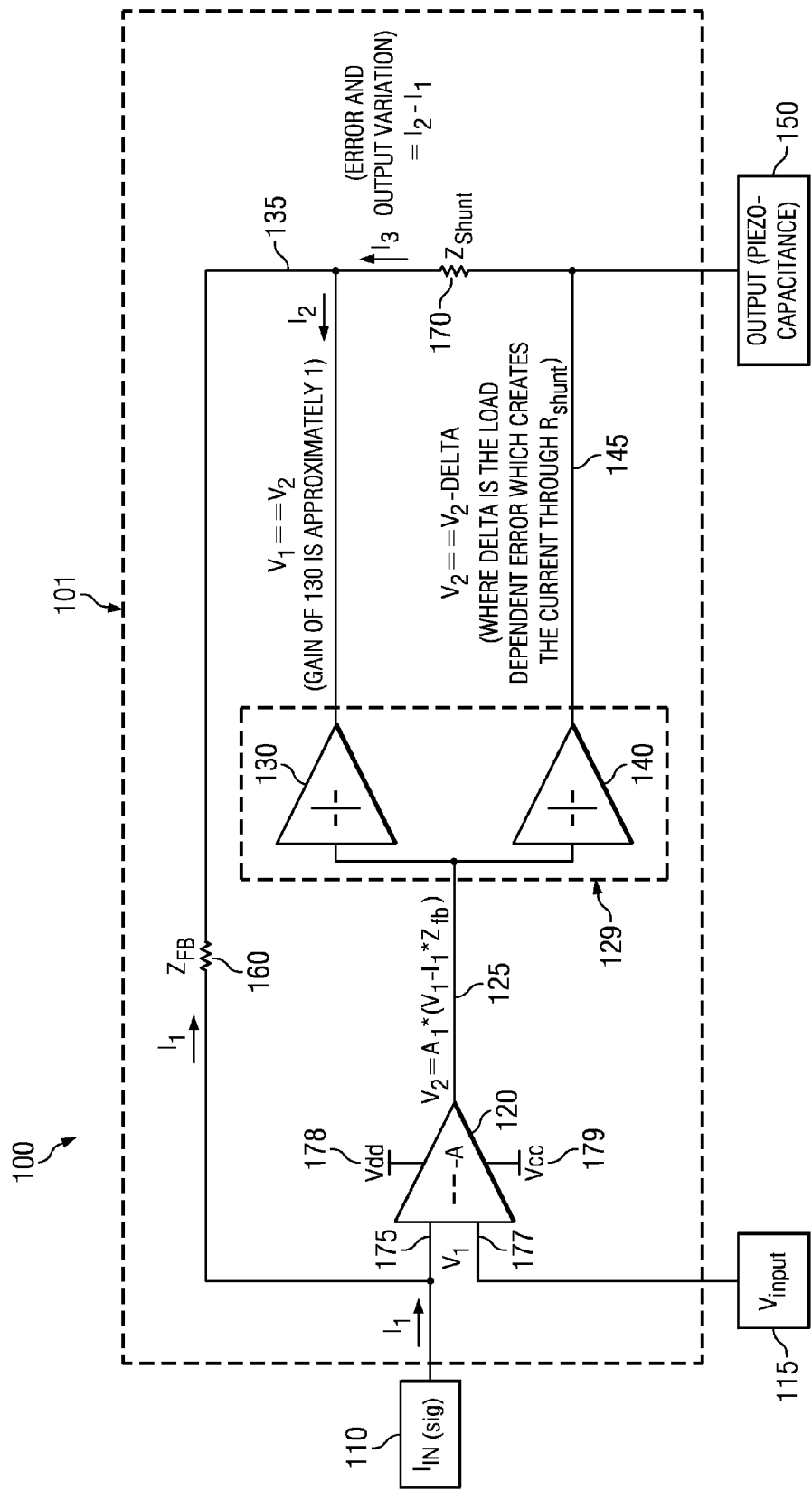
FIG. 1 illustrates a block diagram of a system of a high-voltage driver for piezo haptics constructed according to the principles of the present disclosure.

Turning to FIG. 1, illustrated is one embodiment of a block diagram of a system of a high-voltage driver to drive piezo haptics 100 constructed according to the principles of the present disclosure.

In the system 100, an integrated circuit (IC) 101 is a high-voltage driver for piezo haptics. The IC 101 includes an input amplifier 120 having a gain greater than one. The input amplifier 120 can be a folded cascode amplifier. The input amplifier 120 is an inverting amplifier, coupled to an input node 175, with a gain of negative "A", wherein "A" is a value greater than one. The gain of "A" can be any range of implementable values, and in one embodiment is a gain of up to one hundred million. An output of the input driver 120 is coupled to an output node 125.

A voltage source, such as $V_{input}$ 115, is also coupled to the IC 101. More specifically, it provides a center reference voltage for the input amplifier 120 at an input node 177, and is therefore a reference voltage for the input amplifier 120. In some embodiments, some typical voltage values $V_1$ employed are from 0 volts to 52 volts. Advantageously, in one embodiment, a voltage output at node 145 can vary and be driven from substantially zero volts to substantially 105 volts, a high voltage amount, as driven across a high voltage rail at a Vdd 178 and a low voltage rail Vcc 179, as will be described below.

An input of a first amplifier 130 of an amplifier pair 129, a parallel output stage, is coupled to the node 125. An input of a second amplifier 140 of the amplifier pair 129 is also coupled at the node 125. The first and second amplifiers 130, 140 of the amplifier pair 129 are non-inverting buffer amplifiers, and the first amplifier 130 and the second amplifier 140 are each configured to have a voltage gain of substantially one. An output of the amplifier 130 is coupled to a node 135, and an output of the amplifier 140 is coupled to a node 145.

A first impedance $Z_{FB}$ 160 is coupled between the node 135 and the node 175, i.e. between an output of the first amplifier 130 of the amplifier pair 129 and the input to the input amplifier 120. The first impedance is a feedback element, and can be a resistor, although it can be some other form of reactance. The impedance can be a resistor, and can have values between 10 Kilo Ohms and 10 Mega Ohms. In the illustrated embodiment, the first impedance 160 is integrated within the IC 101, as is the second impedance 170. However, in alternative embodiments, the first impedance 160 is external to the IC 101, and can therefore can be replaced or modified by an installer or user. A benefit of an external impedance 160 can be user programmability, and a drawback of an external first impedance 160 can include complications regarding stability. If the second impedance 160 is external, a small external capacitor in parallel with the first impedance 160 0.1 pF to 10 pF would be employed to stabilize the system.

A second impedance 170 is coupled between the node 135 and the node 145, i.e., the output of the first amplifier 130 of the amplifier pair 129 is coupled to the output of the second amplifier 140 of the amplifier pair 129, and is integrated within the IC 101. The second impedance 170 can be a resistance, and operates as a "shunt" element. A "shunt" element can be generally defined as an element that allows an electric current to pass around another point in the circuit. in the IC 101, this is between node 135 and node 145.

Generally, the second impedance 170 conveys a current that is proportional to a voltage difference between the output of the first amplifier 130 at node 135 and the second amplifier 140 at node 145 of the amplifier pair 129. In one embodiment, the second impedance 170 can have a value from substantially 10 ohms resistance to substantially 100 kilo ohms resistance. This enables the system 100 to drive the piezo-capacitance 150 through use of the second amplifier 140, and monitor the output 150 with the first amplifier 130, without a direct monitoring of the output 150 through a single output amplifier, reducing feedback and stability concerns.

In an alternative embodiment, an input resistor Ramp (not illustrated) is also coupled between $I_{in}$ 110 and the node 175 of the input amplifier 120. If the input signal is a voltage, Ramp is employed. Both a voltage input signal and a current signal can be employed in alternative embodiments.

An input signal, such as generated by current signal generator 110, is coupled to the IC 101. More specifically, the current signal generator 110 is coupled to the node 175. The input signal can be modulated and can typically have a carrier frequency of substantially from 100 Hz to substantially 100 kHz.

In a further embodiment, a substantially capacitive load 150 is coupled to the node 145, which is coupled to the output of the second amplifier 140. The substantially capacitive load is typically a piezo-capacitance, and can be used in haptics. The capacitive load of the piezo-capacitance 150 may be a value of, for example, substantially zero nanofarads to substantially three microfarads, whereas a series resistance can be as large as 100 ohms and parallel resistance is expected to be larger than 1 MegaOhms. The substantially capacitive load can be used for driving haptics, wherein a large voltage, and a variable voltage, is typically needed.

The voltage gain of IC 101 is set by the ratio of either $R_{fb}$/Ramp or by $I_{in}*R_{fb}$. Typically the value can be from 1 V/V to 1000 V/V. In one embodiment, the system 100 is approximately 2V/uA using the $I_{in}$ sig 110 current source.

In one example usage, current is set by the load, such the capacitive load 150, and a derivative of the output signal conveyed to the capacitive load 150. I=C*dV/dT. For a sinusoidal signal, the current applied to the output 150 will be C*2*Pi*F*Va. C=$C_{load}$. F=Signal frequency. Va is an output amplitude ("V2"). Therefore, the current delivered to the load 150 is proportional the load capacitance 150, although the system can handle other relationships.

Regarding the high-voltage driver for piezo haptics 100, it can work substantially as follows.

A current signal to a haptic having a piezo-capacitance, such as output load 150, is generated by the current signal generator 110. The current signal is then driven over the node 175 and then creates a voltage drop across the first reactance 160, a feedback element. Note that the first amplifier attempts to keep a voltage at node 175 and node 177 substantially identical. The input amplifier 120 amplifies I1 by $Z_{FB}$ to get an output voltage of $V_1-I_1Z_{FB}$ at node 135, which then gets conveyed as a voltages to node 125 at the first amplifier 130, which in turn then gets conveyed through the second amplifier 140 to the node 145. With no load, nodes 135 and 140 should ideally be essentially identical values at all times.

However, when driving the substantially capacitive load 150, there are a number of situations wherein a voltage at node 135 can be different than a voltage at node 145. For example, a high rate of voltage change or significantly large value of ($C_{load}$*dV1 node 45/dT), a change in capacitance of the piezo capacitance 150, and a change of operating parameters of the piezo capacitance 150, can all affect a voltage at node 145, as the second amplifier 140 is not an infinitely "stiff" source.

This voltage difference is then introduced as a proportional current as current $I_2$ into node 135, wherein $I_2$ is the voltage difference of node 145 and node 135, divided by the impedance value of the second impedance 170. In other words, the second impedance value 170 acts as a "shunt" resistor between nodes 145 and 135. In further embodiments, individual error of amplification, (i.e. the substantial unity gain of first amplifier 130 and second amplifier 140 are not precisely equal, an error) is also expressed as at least part of $I_2$.

In the system 100, substantially no current will flow into amplifier 120 at node 175. $I_3=I1-I_2$. In the system 100, the input amplifier 120 forces a current $I_1$ to drive the first impedance 160, a feedback element, generating a feedback output amplifier 140 to determine an appropriate output voltage at node 125, which is then conveyed to node 135 and node 145. With no load, nodes 135 and node 145 should be substantially identical voltages.

However, introducing a load on node 145 will cause more current (proportional to the capacitive load, frequency, and amplitude) to flow in or out of node 145 into output 150. This will cause a differential voltage between nodes 135 and 145, as the second amplifier 140 is not an infinitely "stiff" amplifier. A voltage differential between the two will be accounted for by a voltage across Zshunt 170, which creates a current $I_3$, which affect the current $I_2$, and therefore $I_1$, which changes the voltage across $Z_{FB}$, and therefore node 135 will adjust until equilibrium is restored.

Alternatively, the amplifiers 130, 140 may not be sufficiently matched for gain, up to a limit, the Zshunt 170 can help compensate for differences in the gain between the two amplifiers. The system 100 is typically designed to have substantially a same gain within the normal stochastic variance of manufacturing to help approach 'optimal' performance.

Use of the pair of amplifiers 129 as described has a number of advantages. The system 100 takes advantage of a feedback path $I_1$ to help ensure compensation for variations of the load 150. Advantageously, the consequences of changes of the capacitance or impedance of the load 150, or of current that is to be delivered to the out 150, is substantially minimized for stability concerns of the system 100. Use of the parallel amplifier pair 129 with employment of the second resistance 170 allows the system 100 to monitor a voltage at node 145, the output voltage, without many of the stability concerns of conventional high-voltage drivers for piezo-capacitance haptics. The first impedance 160 then provides the proper feedback loop, and the second impedance 170, allows for a shunt current to occur between the first output amplifier 130 and the second amplifier 140.

Generally, in traditional two stage feedback systems, the load capacitance directly contributes to the stability concerns by introducing a pole to the close loop system, which is inversely proportional to the output impedance of the output stage multiplied by the load capacitance. Open loop drive (system minus 170) schemes do not have the stability concerns since $C_{load}$ is not part of the feedback loop, but suffer terrible fidelity performance. The addition of the second reactance Zshunt 170 balances the stability and fidelity requirements and yields a smaller, lower power, wider load range capable solution. In some embodiments, the system 100 has been calculated to generate up to 20 dB less total harmonic distortion.

Moreover, many of the elements of the high-voltage driver system 100 can be integrated on the IC 101. This can give rise to significant savings of chip real estate, in energy conservation, and ease of use.

In a further aspect, a second input amplifier 120 is coupled to the $I_{in}$ 110 and the $V_{input}$ 115. The second amplifier 120 is also coupled to a second amplifier pair 129. The second amplifier pair 129 is coupled across its own $Z_{FB}$ 160 and $Z_{shunt}$ 170. The second amplifier pair 129 is coupled to a second output 150, which can be driven independently of a first amplifier 120. In a yet further aspect, a number of implementable amplifiers 120 and amplifier pairs 129 can be each coupled to its own output 150.

Figure 2:
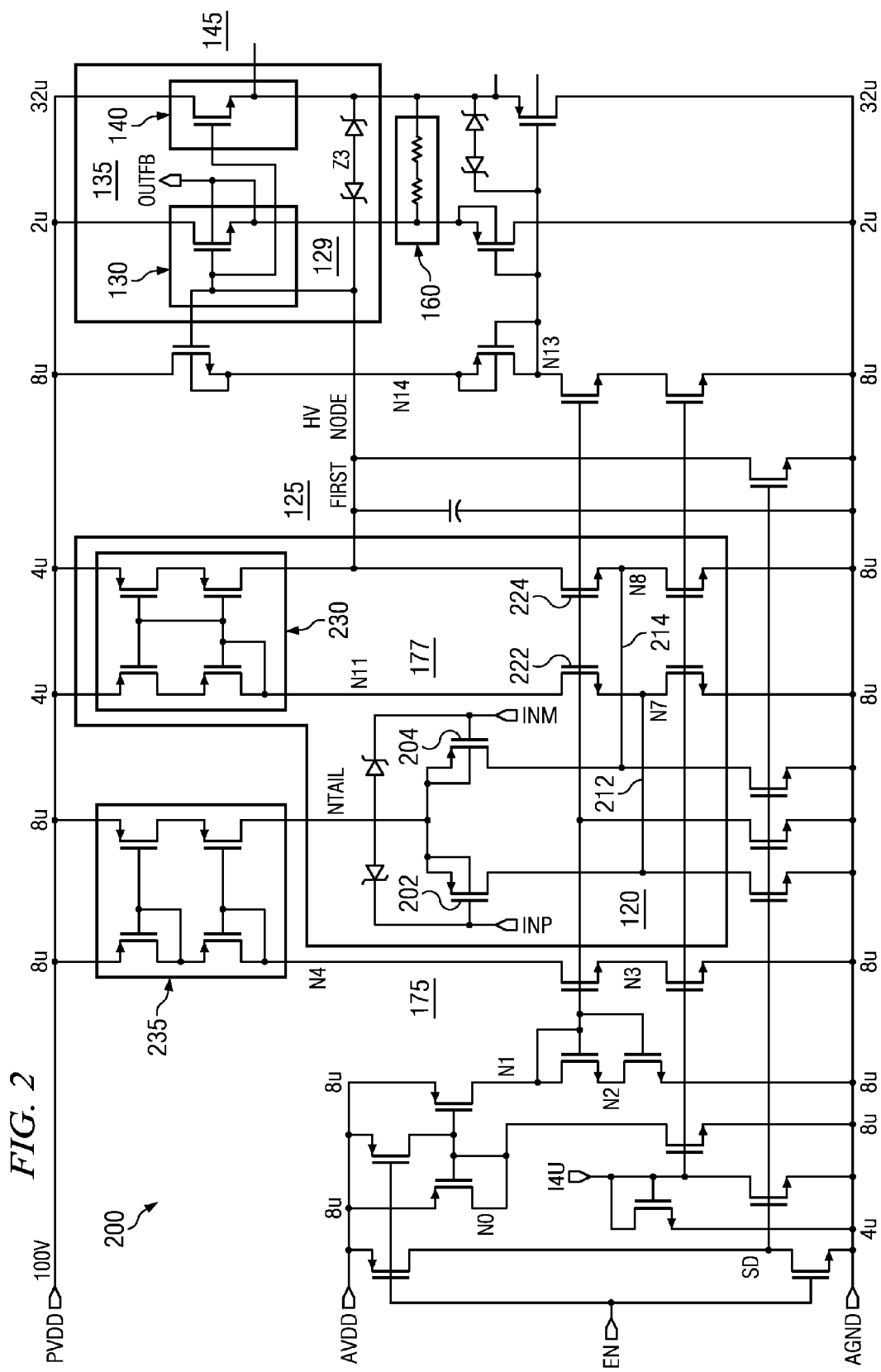
FIG. 2 illustrates an example circuit diagram of elements of FIG. 1 in more detail.

FIG. 2 illustrates various further details of the high-voltage driver to drive piezo haptics 100 of FIG. 1, as a high-voltage circuit 200, which can be at least part of the IC 101. As is illustrated, the input amplifier 120 has the input nodes 175, 177 which are each coupled to one a differential pair of PFETs 202, 204, respectively. As is illustrated, an example voltage applied to the PFETs 202, 204 modifies the resistance characteristics these PFETS and current derived from a current source 235.

Generally, node 212 and node 214 typically do not substantially change voltage; instead, in the Folded Cascode single stage architecture 120, the node 212 and node 214 remain substantially fixed in voltage. PFETs 202 and 204 convey current from a current source 230, differentially into node 212 and node 214.

Generally, if more current flows into node 212, less into node 214 then less will flow from current source 230. This is because the NFETs below node 212 and node 214 act as current drains with fixed values. Since the current drawn from current source 230 is less, it reflects less onto the node 125. Since the current flowing into node 214 is less, the current source below pulls more current through PFET 224 and this is reflected on node 125. Since less current is sourced onto node 125 and more is sinking, the node voltage 125 will drop proportional to the difference in the current in current source 230 and current sink 224 multiplied by the output impedance at node 125. Zout at 125 can be greater than $10^9$ ohms, so the gain can be very high.

As is illustrated, coupled to the node 125 is the first amplifier 130 and the second amplifier 140 of the pair of parallel output amplifiers 129. The first amplifier 130 and the second amplifier 140 have the output node 135 and the output node 145, respectively. As is illustrated coupled across the output nodes 135, 145 is the second impedance 170, a shunt resistor. Advantageously, in the illustrated embodiment, the first impedance 160, the feedback element, is internal to the IC 101. This output stage 129 can be a non-inverting push-pull/source follower circuit. The NFET 130 and the PFET connected to 135 form a non-inverting "push pull" pair since the NMOS 130 can source current and PMOS 140 can source the current.

Figure 3A:
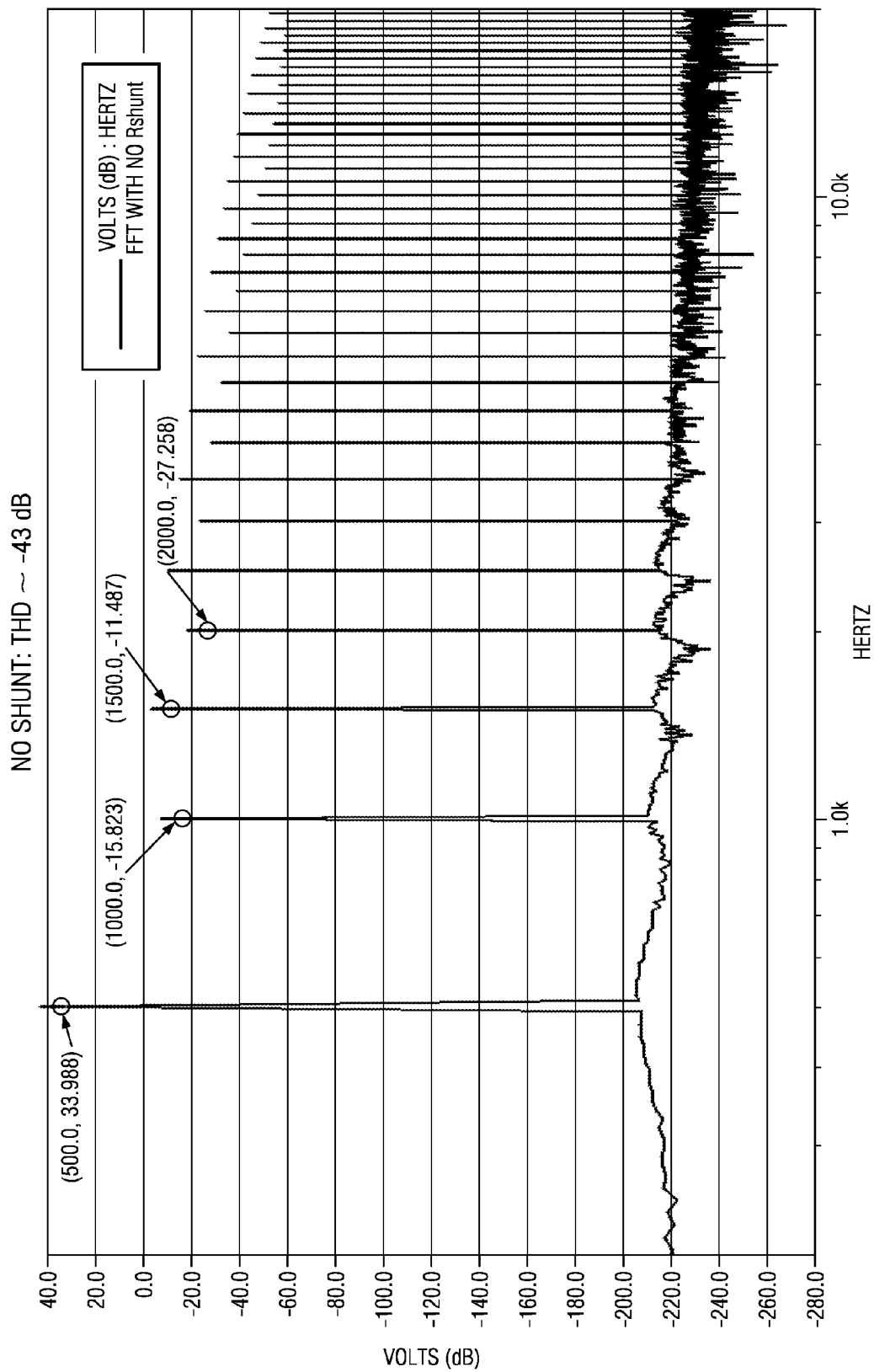
FIGS. 3A and 3B illustrate simulated levels of harmonic distortion of a haptic driver circuit without and with employment of a shunt resistor.

Turning to FIG. 3A illustrated is a simulated harmonic distortion of an output 150, wherein a haptic driver does not have a Rshunt resistor. The average harmonic distortion is –43 dB or 0.7%. Generally –40 dB or 1% is regarded as the ceiling (worst allowed value) for THD. Employment of a driver, such as a haptic driver, typically require significantly higher performance. Also, increased distortion leads to increased power dissipation by the device when driving into our load.

Figure 3B:
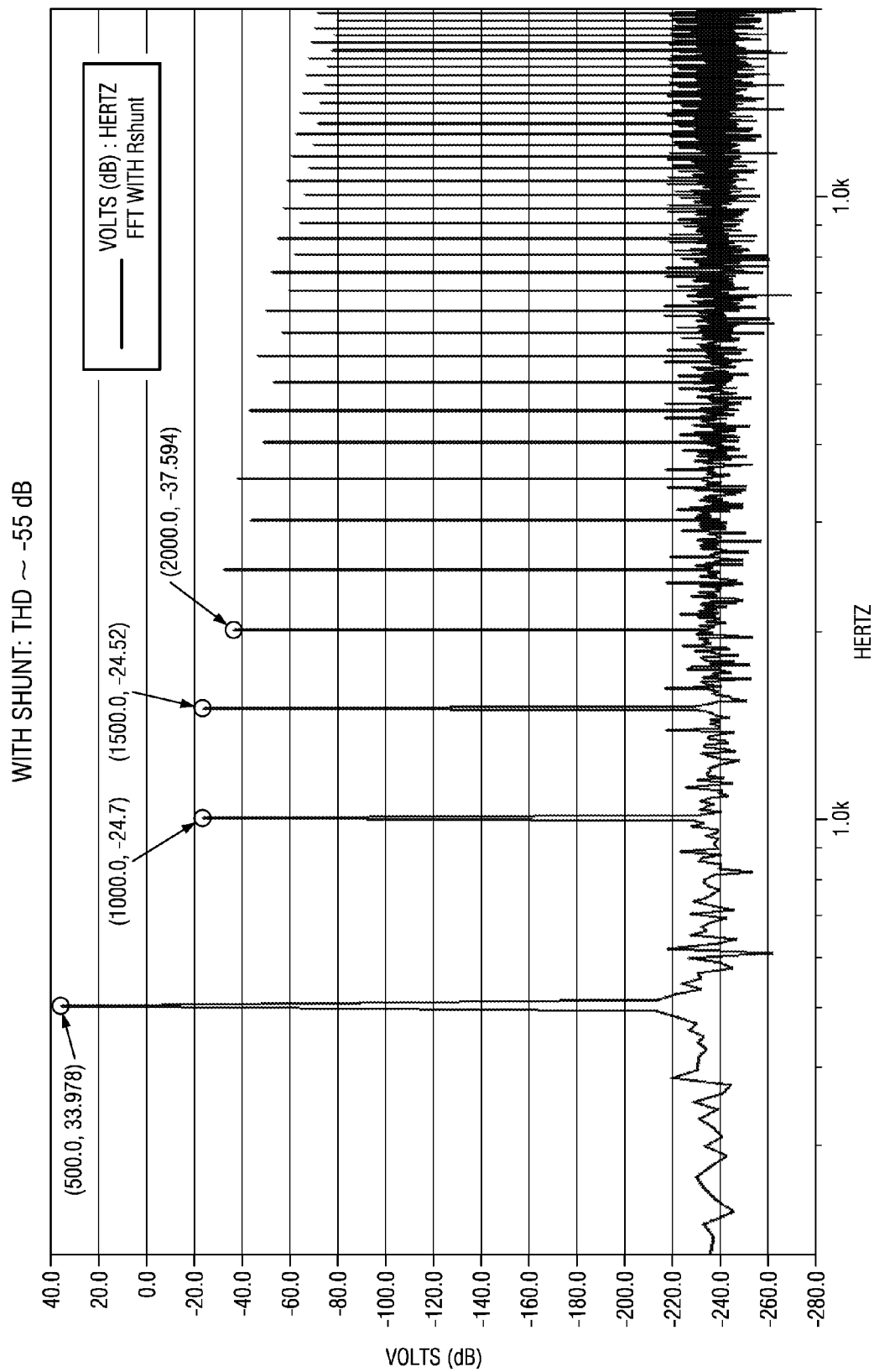

Turning to FIG. 3B illustrated is a simulated harmonic distortion of an output 150, wherein a haptic driver does have a Rshunt resistor. The average harmonic distortion is –55 dB, less than FIG. 3A.

In FIGS. 3A and 3B, a fundamental harmonic occurs at –34 dB and the second harmonic (1.0 kHz) is at –24.7 (with Shunt) and the third harmonic (1.5 kHz) is –11.5 dB (without the shunt). The THD is calculated by the ratio of the total power in the harmonics divided by the total power in the fundamental. This can be approximated by the difference between the fundamental and the highest harmonic. Therefore without shunt (FIG. 3A) is 34 dB–(–11.5 dB)=45.5 dB and with the shunt (FIG. 3B) it is 34–(–24.7)=58.7 dB.

Those skilled in the art to which this application relates will appreciate that other and further additions, deletions, substitutions and modifications may be made to the described embodiments.

What is claimed is:
1. An apparatus, comprising:
an input amplifier having a gain greater than one;
a first amplifier of an amplifier pair coupled to an output of the input amplifier;
a second amplifier of the amplifier pair coupled to the output of the input amplifier;

wherein a gain of the first amplifier and the second amplifier of the amplifier pair are each configured to be a value of substantially one;
a first impedance coupled between an output of the first amplifier of the amplifier pair and an input of the input amplifier; wherein the first impedance is a feedback element;
a second impedance coupled between the output of the first amplifier of the amplifier pair and an output of the second amplifier of the amplifier pair,
a substantially capacitive load coupled to the output of the second amplifier; and
a current source coupled to the input amplifier.

2. The apparatus of claim 1, further comprising a substantially capacitive load coupled to the output of the second amplifier.

3. The apparatus of claim 2, wherein the substantially capacitive load is a piezo-capacitance, wherein the piezo-capacitance is employed in haptics.

4. The apparatus of claim 3, wherein the capacitive load of the piezo-capacitance is a value from substantially one nanofarad to substantially one microfarad.

5. The apparatus of claim 1, wherein a gain of the first amplifier is configured as a gain from greater than one to one hundred million.

6. The apparatus of claim 1, wherein the first impedance is a feedback element, and has a value from substantially 1000 ohms resistance to substantially $10^6$ ohms resistance.

7. The apparatus of claim 1, wherein the output voltage can vary from substantially zero volts to substantially 105 volts.

8. A system, comprising:
an input amplifier having a gain greater than one;
a first amplifier of an amplifier pair coupled to an output of the input amplifier;
a second amplifier of the amplifier pair coupled to the output of the input amplifier,
wherein a gain of the first amplifier and the second amplifier of the amplifier pair are each configured to be a value of substantially one;
a first impedance coupled between an output of the first amplifier of the amplifier pair and an input of the input amplifier, wherein the first impedance is a feedback element;
a second impedance coupled between the output of the first amplifier of the amplifier pair and an output of the second amplifier of the amplifier pair; and
a substantially capacitive load coupled to the output of the second amplifier.

9. The system of claim 8, wherein the substantially capacitive load is a piezo-capacitance employed in haptics.

10. The apparatus of claim 8, wherein the first and second amplifier of the amplifier pair each comprise a push-pull non-inverting output stage.

11. The apparatus of claim 8, wherein the second impedance includes a shunt resistance having a value from substantially zero ohms resistance to substantially 100 k ohms resistance.

12. The apparatus of claim 8, wherein the first amplifier comprises a folded cascode amplifier.

13. The apparatus of claim 8, wherein the second impedance conveys a current that is proportional to a voltage difference between the output of the first amplifier and the output of the second amplifier of the amplifier pair.

14. The apparatus of claim 13, wherein the input amplifier adjusts its output voltage in proportion to the voltage drop, thereby adjusting a voltage delivered to the substantially capacitive load.

15. The apparatus of claim 13, wherein:
the input amplifier;
the first amplifier of the amplifier pair;
the second amplifier of the amplifier pair; and
the second impedance, are integrated within a single integrated circuit.

16. The apparatus of claim 15, further comprising:
a second input amplifier coupled to a second amplifier pair wherein, the second amplifier pair is coupled across its own feedback resistance and shunt resistance.

17. The apparatus of claim 15, wherein the second impedance is integrated with the single integrated circuit.

18. An apparatus, comprising:
an input amplifier having a gain greater than one;
a first amplifier of an amplifier pair coupled to an output of the input amplifier;
a second amplifier of the amplifier pair coupled to the output of the input amplifier;
wherein a gain of the first amplifier and the second amplifier of the amplifier pair are each configured to be a value of substantially one;
a first impedance coupled between an output of the first amplifier of the amplifier pair and an input of the input amplifier, wherein the first impedance is a feedback element;
a second impedance coupled between the output of the first amplifier of the amplifier pair and an output of the second amplifier of the amplifier pair,
a substantially capacitive load coupled to the output of the second amplifier; and
a current source coupled to the input amplifier, wherein the first and second amplifiers of the amplifier pair each comprises a push-pull non-inverting output stage.

19. The system of claim 18, wherein the system can provide up to substantially a 105V supply to a substantially capacitive load, and
wherein an input signal coupled to the input amplifier can be modulated and conveyed to an output of the second amplifier to be conveyed to a capacitive load coupled to the output of the second amplifier has a carrier frequency of substantially from 100 Hz to substantially 100 kHz.

* * * * *